(12) United States Patent
Tailliet

(10) Patent No.: US 6,292,396 B1
(45) Date of Patent: Sep. 18, 2001

(54) METHOD AND DEVICE FOR THE PROGRAMMING OF AN ELECTRICALLY PROGRAMMABLE NON-VOLATILE MEMORY FOR IMPROVED RELIABILITY

(75) Inventor: Francois Tailliet, Epinay sur Seine (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/556,476

(22) Filed: Apr. 21, 2000

(30) Foreign Application Priority Data

Apr. 21, 1999 (FR) .................................................. 99/05051

(51) Int. Cl.[7] .................................................. G11C 16/06
(52) U.S. Cl. .................................... 365/185.2; 365/185.29
(58) Field of Search ........................ 365/185.18, 185.19, 365/185.2, 185.24, 185.29, 185.33

(56) References Cited

U.S. PATENT DOCUMENTS

| | | | |
|---|---|---|---|
| 5,703,807 | 12/1997 | Smayling et al. | ............. 365/185.29 |
| 5,812,455 | 9/1998 | Iwata et al. | ..................... 365/185.18 |
| 5,822,247 | * 10/1998 | Caser et al. | ..................... 365/185.29 |
| 6,016,271 | * 1/2000 | Rolandi et al. | ................... 365/185.2 |
| 6,097,632 | * 8/2000 | Roohparvar | ..................... 365/185.29 |
| 6,108,246 | * 8/2000 | Umezawa et al. | ................ 365/185.2 |
| 6,151,255 | * 11/2000 | Joo et al. | ........................ 365/185.29 |

FOREIGN PATENT DOCUMENTS

| | | |
|---|---|---|
| 0 658 904 A2 | 6/1995 | (EP) . |
| 0 762 428 A1 | 3/1997 | (EP) . |

* cited by examiner

*Primary Examiner*—Trong Phan
(74) *Attorney, Agent, or Firm*—Theodore E. Galanthay; Jon A. Gibbons; Fleit, Kain, Gibbons, Gutman & Bongini P.L.

(57) ABSTRACT

A device for the programming of cells of an electrically programmable non-volatile memory. The device comprising a first reference input for receiving an erase signal for erasing one or more memory cells in the non-volatile memory and a second reference input for receiving an programming signal for programming one or more memory cells in the non-volatile memory. A regulation circuit coupled to the first reference input and coupled to the second reference input for regulating the magnitude of an erasure signal and for regulating the magnitude of a programming signal so that an electric field of approximate equal absolute magnitude is created on the floating gate of one or more memory cells during an erase type operation and an programming type operation.

29 Claims, 4 Drawing Sheets

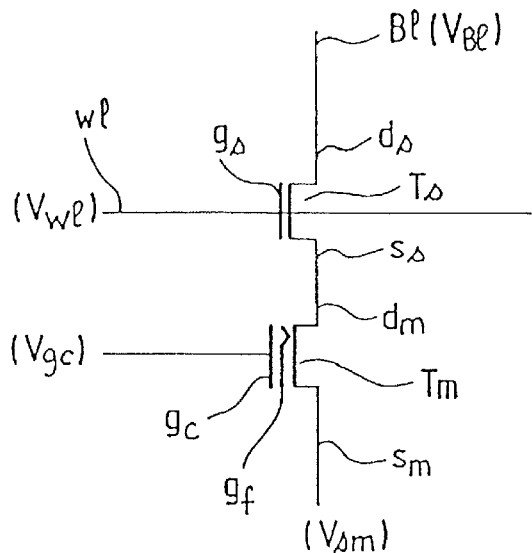
FIG_1
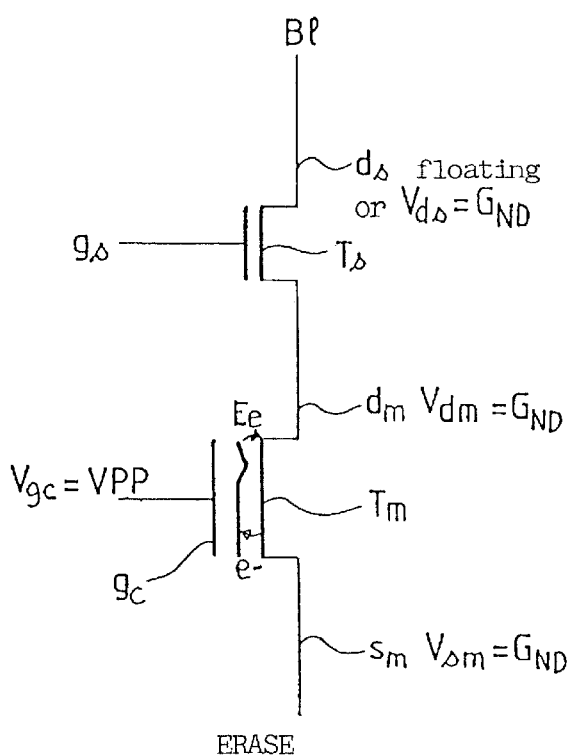
FIG_2a
ERASE
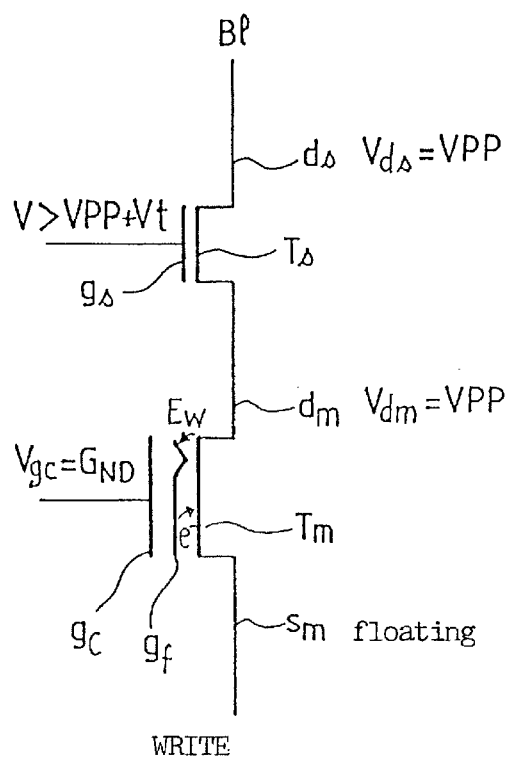
FIG_2b
WRITE

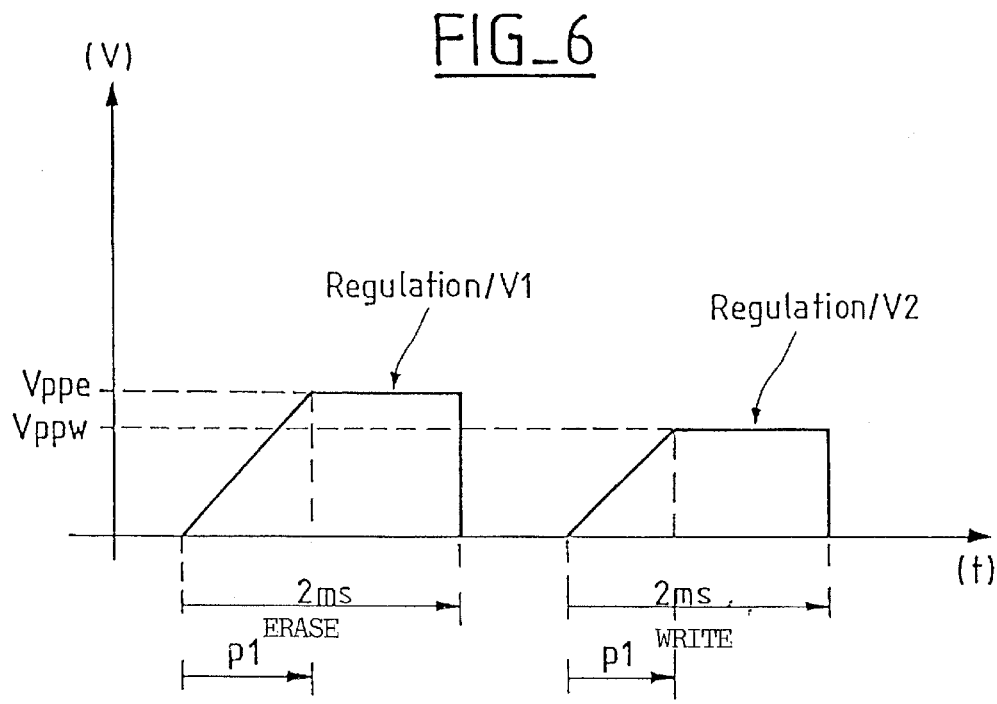
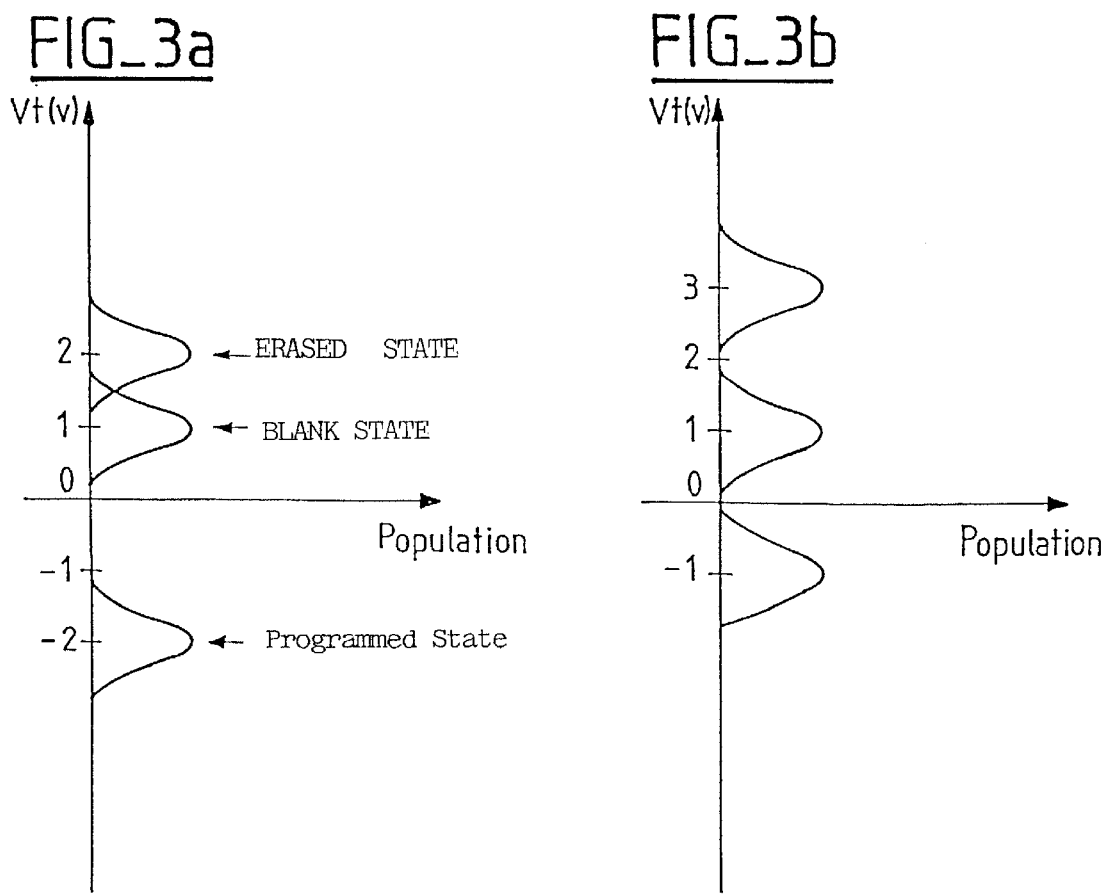

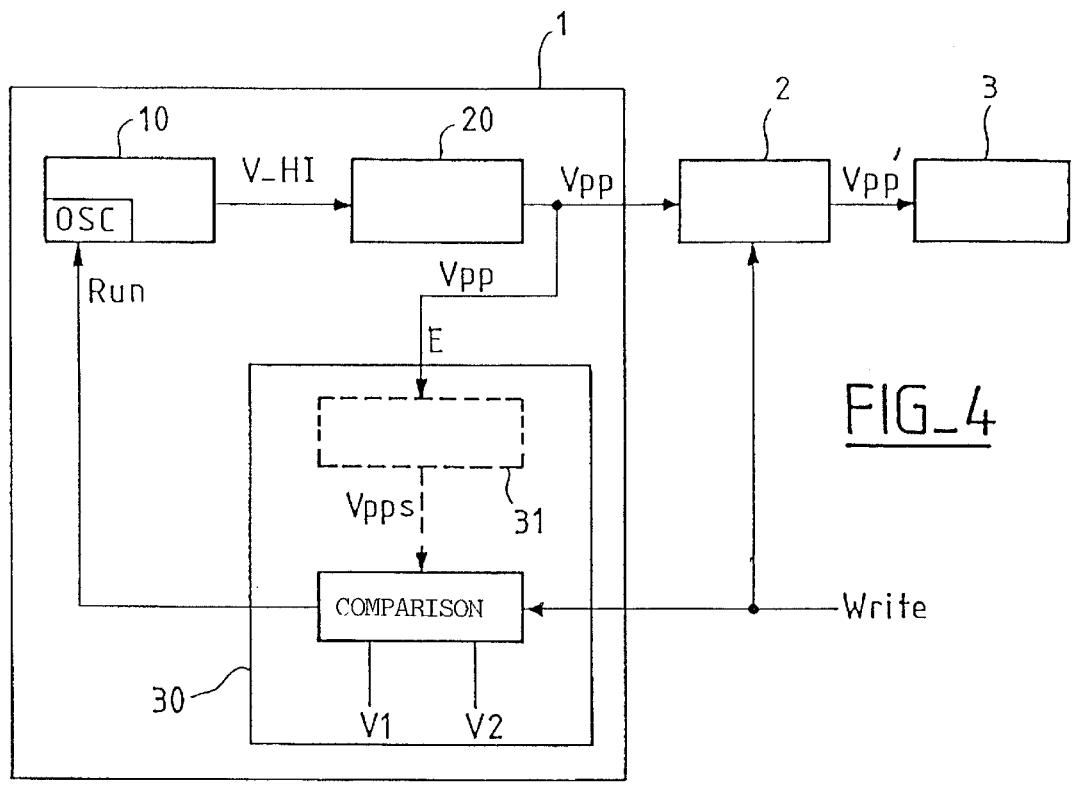
FIG_4
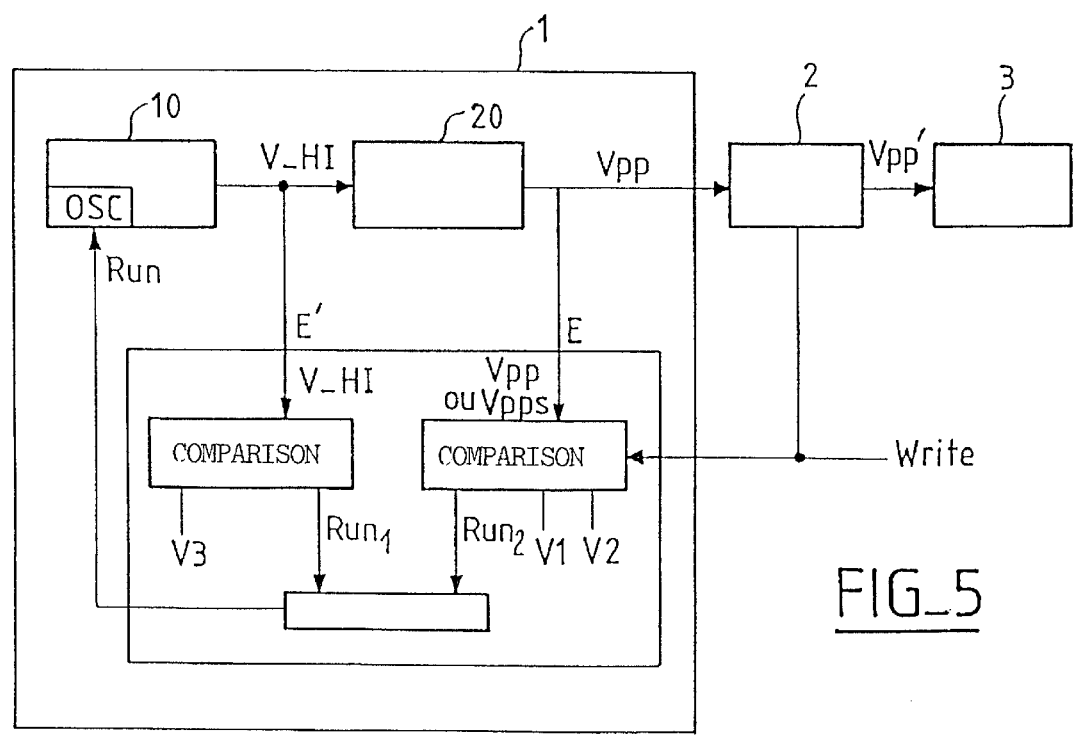
FIG_5

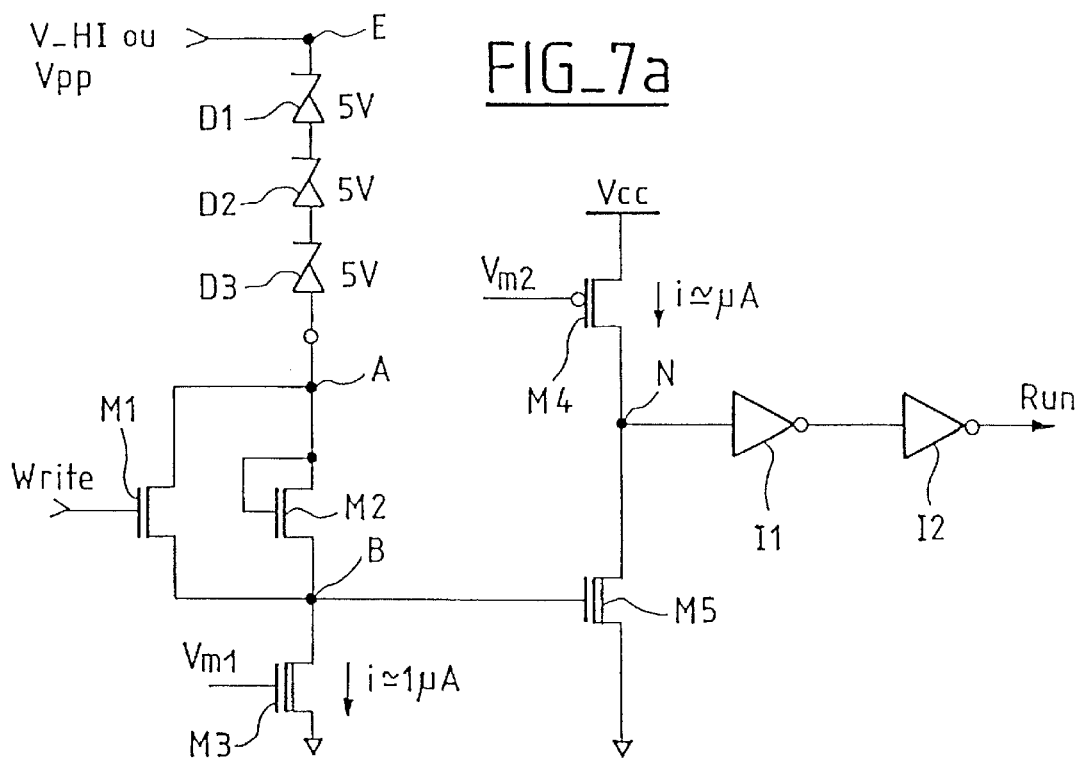
FIG_7a
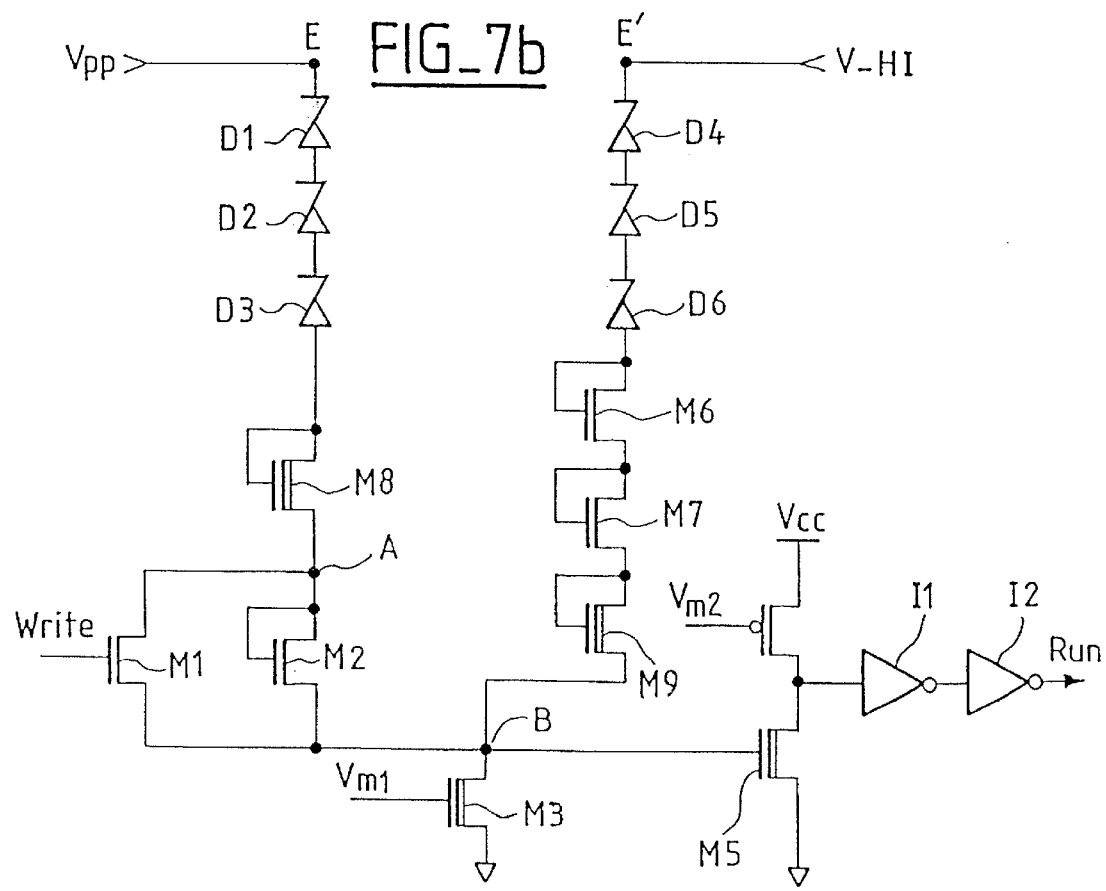
FIG_7b

METHOD AND DEVICE FOR THE PROGRAMMING OF AN ELECTRICALLY PROGRAMMABLE NON-VOLATILE MEMORY FOR IMPROVED RELIABILITY

CROSS REFERENCE TO RELATED APPLICATIONS

This application is based upon and claims priority from prior French Patent Application No. 99-05051, filed Apr. 21, 1999, the entire disclosure of which is hereby incorporated by reference in its entirety.

BACKGROUND OF THE INVENTION

1. Field of the Invention

The invention relates to electrical non-volatile memory and more particularly relates to an improved Electrical Erasable Programmable Read Only Memories (EEPROMs) having an electrical erase field which reduces the aging of tunnel oxide.

2. Description of Related Art

The present invention relates to a device for the programming of an electrically erasable programmable read-only or non-volatile memory, especially of the EEPROM or flash EEPROM type.

Electrically programmable non-volatile memories are usually organized in matrices of cells each placed at the intersection of a bit line and a word line. Each cell has a floating-gate MOS transistor. It is this floating gate that enables the storage of the binary information through the capacitance formed by the floating gate and the control gate of the transistor.

Each cell of a memory of this kind is electrically programmable to contain a binary information that is a "1", the programming operation then being a so-called write operation or a "0", the programming operation then being an erase operation.

These erase and write operations enable the modification of the charge of a floating gate by an electrical field, so that the threshold voltage of the floating-gate transistor of the cell is modified. It is known in the EEPROM art that the threshold voltage of a transistor is the minimum voltage to be applied between its gate and its source so that it is conductive. This threshold voltage is modified by varying the charge carried by the gate. If the gate carries a quantity of positive charges, the threshold voltage is thereby diminished. If it carries a quantity of negative charges, the threshold voltage is thereby increased.

Depending on the type of programming operation performed, namely whether it is a write operation or a read operation, the charge of the floating gate is made to vary by making a certain current travel in one direction or the other through a thin layer of tunnel oxide located beneath the floating gate, and the semiconductor substrate. Depending on the direction of the current, namely depending on the polarity of the electrical field applied, the floating gate is charged so that a quantity of positive charges is retrieved or it is discharged so that a quantity of negative charges is retrieved for a quantity of zero charges when the cell is in the blank state.

If the cell has been erased, the capacitance associated with the floating gate is negatively charged, and the threshold voltage of the cell is higher than that of a blank cell.

If the cell has been programmed, the capacitance associated with the floating gate is positively charged, and the threshold voltage of the cell is lower than that of a blank cell.

It is know in the EEPROM art that, the successive erase and write operations cause the memory cell to age. More particularly, this aging affects the tunnel oxide of these cells due to the total quantity of charges that flow through the tunnel oxide following the successive erasing and writing cycles.

The aging of the tunnel oxide has several undesirable consequences may be expressed in different ways, namely:
one short coming of the oxide aging is that the tunnel oxide may have leakages so that the cell is no longer capable of preserving a sufficient quantity of charge to represent the binary information programmed, during a guaranteed retention period;
another short coming the tunnel oxide no longer permits the accurate passage of the charges whether in erasure or in writing, so that the cell cannot be reprogrammed;
Now, the quality of a non-volatile memory is measured by the data retention period and by the number of permissible programming cycles. And this quality of non-volatile memories is directly related to the aging of the tunnel oxide.

To limit the aging of the tunnel oxide, it is necessary to reduce the quantity of charges stored in the cells. Diminishing the quantity of stored charges means diminishing the gaps between the threshold voltages corresponding to the blank, written and erased states.

To enable a reduction in the quantity of charges stored in the cells, it is necessary to be able to use the most sensitive possible read circuitry that can discriminate between two logic states "0" and "1" close to the blank state. Circuits of this kind exist, based on current/voltage converters that are well known and used by those skilled in the art.

However, to reduce the aging of the tunnel oxide, it is also necessary to have a programming device capable of generating programming signals suited to the production of this very small quantity of charges in the cells.

The quantity of charges in the memory cells is a function of the programming time. This programming time is specified for each memory. In practice, there are known ways of controlling this parameter of the programming, in a very stable manner, through a time lag circuitry. This programming time therefore in no way increases the aging of the tunnel oxide.

The quantity of charges in memory cells is also a function of the voltages applied to the cells, and more specifically of the programming voltage. It will be shown that this parameter of the programming itself affects the aging of the tunnel oxide of the memory cells.

Indeed, for one and the same programming voltage VPP used in erasure or writing, the quantity of charges induced is not the same (in terms of absolute value) in one direction or the other, the electrical field applied not having the same intensity (in terms of absolute value).

Let us take the example of a cell of an EEPROM type memory organized according to a matrix of bit lines and word lines. A cell of this kind is represented schematically in FIG. 1. In a well-known way it includes a selection transistor Ts whose gate $g_s$ is connected to a word line W1 of the memory and whose drain $d_s$ is connected to a bit line B1 of the memory. It furthermore comprises a floating-gate transistor Tm containing the binary information programmed in the cell. This floating-gate transistor comprises a control gate $g_c$ and a floating gate $g_f$. Its drain $d_m$ is connected to the source $s_s$ of the selection transistor. The word line W1, the bit line B1, the control gate $g_c$ and the source $s_m$ of the floating-gate transistor receive control voltages respectively referenced $V_{W1}$, $V_{B1}$, $V_{gc}$ and $V_{sm}$, given by a circuitry for the selection of the memory cells (not shown).

$V_{gf}$ refers to the potential on the floating gate and $V_{dm}$ the potential of the drain on the floating-gate transistor Tm.

To program a cell, a programming voltage commonly referenced VPP is used. This voltage is applied appropriately to create the required electrical field, for a write or erase operation. This programming voltage is usually produced internally in the integrated circuit containing the memory, by a circuit for the generation of a high voltage from the logic supply voltage Vcc of the integrated circuit. This generation circuit usually comprises a charge pump with an oscillator to produce the necessary clock signals. An example of such a circuit is described in detail in the U.S. non-provisional patent application Ser. No. 08/128,871 filed Sep. 29, 1993 entitled "VOLTAGE BOOSTER CIRCUIT OF THE CHARGE-PUMP TYPE WITH A BOOTSTRAPPED OSCILLATOR", now [pending], which is incorporated herein by reference.

In a practical example, where the logic supply voltage Vcc equals 5 volts, the programming voltage generated internally may be equal to about 16 volts. This high programming voltage is applied to the cells differently, depending on the type of programming to be carried out.

FIG. 2a gives a schematic view of what happens during an erasure type of programming operation. The voltage $V_{gc}$ applied to the control gate is equal to the programming voltage Vpp, and the potential $V_{dm}$ at the drain is at zero volts.

The electrical field of erasure Ee applied to the tunnel oxide zone is equal to:

$$Ee=(VPP*dV_{gf})/dV_{dm})/e=(VPP*A_g)/e$$

where $A_g$=0.7 (in terms of typical value for a given technology).

It induces a negative electrical charge Qw of the floating gate: the capacitance associated with the floating gate is negatively charged.

FIG. 2b gives a schematic view of what happens during a write type programming operation. The voltage $V_{gc}$ applied to the control gate is equal to zero volts, and the potential $V_{dm}$ on the drain takes the level of the programming voltage VPP (assuming that the gate $g_s$ of the selection transistor receives a control voltage at least equal to the programming voltage VPP increased by its threshold voltage for the lossless switching over of the programming voltage VPP applied to the bit line).

The write electrical field Ew applied to the tunnel oxide zone is equal to:

$$Ew=(VPP*(1-dV_{gf})/dV_{gc})/e=(VPP*(1-Ad))/e$$

where $A_d$=0.25 (in terms of typical value as a function of the technology considered).

Now in practice, Ag is not equal to 1−Ad. In the example, Ag=0.7 and 1−Ad=0.75. The electrical erase field Ee and electrical write field, Ew are therefore not equal.

As can be seen in FIG. 3a, which represents the threshold voltages for the three possible states of a population of cells of a memory, namely in the blank, erased or written state, a greater quantity of charges is obtained in writing than in erasure. This is expressed, in FIG. 3a, by a divergence between the threshold voltage of the blank cells and the threshold voltage of the written cells that is greater than the divergence between the threshold voltage of the blank cells and the threshold voltage of the erased cells.

The induction of a quantity of charges that is greater in write mode than in erase mode is in the long run, along with the repeated erase and write cycles, a source of stress for the cell.

Accordingly, a need exists to overcome these shortcomings and improve the quality of the non-volatile memories by limiting the aging of the tunnel oxide.

SUMMARY OF THE INVENTION

The invention therefore relates to a device for the programming of cells of an electrically programmable non-volatile memory, comprising means to produce a first programming voltage for erase type operations and a second programming voltage for write type programming operations, these first and second voltages being determined to apply an electrical field that are equal to or close to each other in terms of absolute value during the two types of programming operation.

Preferably, these two voltages are produced by means of a circuit to regulate a high voltage given by a circuit comprising a charge pump. This regulation voltage comprises means to select a first reference voltage to regulate the programming high voltage with respect to this first reference voltage for erase type programming operations, to produce the first programming voltage and means to select a second reference voltage to regulate the high programming voltage with respect to this second reference voltage for write type programming operations, to produce the second programming voltage.

The device according to the invention makes it possible to reduce the stress on the cells, by the reduction of the quantities of charges induced. However, it is also necessary to provide for a reliable reading of the written and erased states of the cells, which are closer. For this purpose, the regulation of the programming voltage must be very precise.

There are many components in the generation of the programming voltage. To begin, a circuit for the generation of a programming voltage usually comprises a charge pump to give a high voltage signal from the logic supply voltage of the circuit followed by a circuit for the generation of a voltage ramp, which makes it possible to check the voltage build-up and the duration of application of the programming voltage. The programming voltage signal at output of the ramp generator is furthermore applied appropriately to the memory cells by a memory cell selection circuitry.

The generation of the programming voltage is not without variations in voltage. There are variations of the programming voltage really applied to the cells corresponding to losses due especially to the use of MOS transistors used in switching (generally N type MOS transistors) in the ramp generator, the cell selection circuitry and the cell selection transistor. These are ohmic type losses, or losses due to the threshold voltage of these transistors, increased as the case may be by the substrate effect.

Next, there are variations in the programming voltage due to the variation in the temperature. The integrated circuits are indeed guaranteed for a certain range of temperature, for example for a range of −0° C. to 125° C. It may be recalled that the typical variation in the threshold voltage of a MOS transistor is −2 mV/°C. These variations in the threshold voltages of the transistors with the ambient temperature therefore has a repercussion on the programming voltage.

Finally, there are variations in the load on the programming voltages. The number of cells to be programmed simultaneously may vary from a few cells, typically eight cells, to some thousands of cells, for example depending on whether what is programmed is only a memory byte or whether the erasure is applied to a block of cells or even to all the cells of the memory at the same time.

In addition to all these variations, there are the variations in the threshold voltage of the transistors, due to the manufacturing method.

In all, the variation in the programming voltage VPP applied to the cells typically reaches 1 volt, even if a very well regulated charge pump is used.

To improve the regulation of the programming voltage, enabling the reduction of the quantities of charges to be induced in the memory cells for error-free discrimination between the different states of the cell, it is provided that the regulation circuit will regulate the programming voltage signal given at output by the ramp generator. In other words, according to the invention, it is planned to regulate the programming voltage as closely as possible to the memory cells.

In one embodiment, the regulation circuit will comprises a circuitry reproducing the losses induced by the circuitry for the selection of the memory cells.

In another embodiment, the high voltage signal given at output by the charge pump with respect to a third reference voltage, greater than the first and second reference voltages.

BRIEF DESCRIPTION OF THE DRAWINGS

Other characteristics and advantages of the invention shall now be described in detail in the following description, given by way of a non-restrictive example, with reference to the appended drawings, of which:

FIG. 1 is a schematic view of an EEPROM type memory cell;

FIGS. 2a and 2b show the voltages applied to the cell respectively in an erasure type programming operation and a write type programming operation, FIGS. 3a and 3b show the distribution of a population of memory cells in the erased, blank and programmed states, depending on whether the programming device used is respectively a prior art device or a device according to the invention;

FIG. 4 is a schematic view of a programming device according to a first embodiment of the invention;

FIG. 5 is a schematic view of a programming device according to a second embodiment of the invention;

FIG. 6 is a graph showing the shape of the programming voltage signals in erase mode and in write mode obtained with a programming device according to the invention; and FIGS. 7a and 7b each show an exemplary embodiment of a regulation circuit that can be used in the invention.

DETAILED DESCRIPTION OF AN EMBODIMENT

However, it should be understood that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and visa versa with no loss of generality.

The invention therefore relates to a device for the programming of cells of an electrically programmable non-volatile memory, comprising means to produce a first programming voltage for erase type operations and a second programming voltage for write type programming operations, these first and second voltages being determined to apply an electrical field that are equal to or close to each other in terms of absolute value during the two types of programming operation.

Preferably, these two voltages are produced by means of a circuit to regulate a high voltage given by a circuit comprising a charge pump. This regulation voltage comprises means to select a first reference voltage to regulate the programming high voltage with respect to this first reference voltage for erase type programming operations, to produce the first programming voltage and means to select a second reference voltage to regulate the high programming voltage with respect to this second reference voltage for write type programming operations, to produce the second programming voltage.

The device according to the invention makes it possible to reduce the stress on the cells, by the reduction of the quantities of charges induced. However, it is also necessary to provide for a reliable reading of the written and erased states of the cells, which are closer. For this purpose, the regulation of the programming voltage must be very precise.

Accordingly, the circuitry disclosed herein limits this stress on the tunnel oxide by maintaining a quantity of charges that are similar to each other, in terms of absolute value, in both the erase mode and in write mode.

For this purpose, it is necessary to have electrical erase Ee and write Ew fields that are identical (in terms of absolute value).

The invention proposes the use of an erase programming voltage referenced Vppe different from a write programming voltage referenced Vppw. These voltages are such that the electrical fields induced are equal. This can be written as:

$(Vppe*Ag)/e=Vppw(1-Ad)/e$, namely:

$(Vppe*Ag)=Vppw(1-Ad)$.

The invention shall be described in an application to an electrically programmable non-volatile memory comprising cells such as are shown in FIG. 1 already described and pertaining to a MOS technology. Thus, hereinafter, the transistors are all MOS type transistors. However, the invention can be applied more generally to any technology used in the manufacture of electrically non-volatile memories. As previously described above, FIG. 3a show the distribution of a population of memory cells in the erased, blank and programmed states, for a prior art programming device. In contrast, FIG. 3b show the distribution of a population of memory cells in the erased, blank and programmed states of a prior art device or a device according to the invention.

FIG. 4 provides a schematic view of a programming device 1 according to the invention, giving a programming voltage to a selection circuitry 2 for the selection of memory cells. This programming voltage signal is referenced Vpp. The programming voltage VPP applied to the cells comes from this signal.

The selection circuitry 2 gives the control signals needed for the selection of one or more cells of a memory 3 organized in matrix form in bit lines and word lines.

The programming device comprises a charge pump 10 that gives a high voltage signal V-HI at output. This high voltage signal is applied to a ramp generator 20, which gives a programming voltage signal Vpp in the form of a pulse with a voltage build-up ramp. The charge pump and the ramp generator are standard elements used in the usual programming devices, well known to those skilled in the art.

The programming device according to the invention furthermore comprises a regulation circuit 30. This regulation circuit comprises a circuit for the comparison of a voltage applied to an input E with a first reference voltage V1 for erase type programming operations and a second reference voltage V2 for write type programming operations. The selection of either one of the reference voltages is done by using a write/erase control signal referenced Write, whose binary level indicates the type of operation, for example "0" for the erasure and "1" for the writing. This write/erase control signal Write is given by a circuit for the control of the memory which is not shown and usually applied to the memory cells selection circuitry, enabling the application of the corresponding voltage levels for the different control signals to be generated.

The regulation circuitry gives a signal Run for the regulation of the charge pump. This regulation signal is usually applied to the oscillator OSC of the charge pump circuit, so that the clock signals needed for the operation of the pump are produced or not produced.

Thus, depending on the level of this regulation signal Run, the charge pump is activated to produce a higher voltage level at output or it is stopped if the level reached at output is sufficient, namely if it is higher than that of the reference voltage concerned. The signal applied to the input E of the regulation circuit 30 may be the high voltage signal V-HI given by the charge pump.

Preferably, to enable the closest possible regulation of the memory cells, thus providing for a greater reliability of the programming, it is the programming voltage signal Vpp given by the ramp generator that is applied to the input E of the regulation circuit 30.

In this case, one variant of the invention shown in dashes in FIG. 4 consists in furthermore simulating the losses and variations that this programming voltage signal will undergo in the circuitry 2 for the selection of the cells of the memory. In this embodiment, the regulation circuit 30 thus comprises a circuit 31 for simulating the cell selection circuitry, receiving the programming voltage signal Vpp at input and giving an output simulated voltage signal $Vpp_s$ normally equal to Vpp'. This simulation circuitry 31 in practice comprises electronic elements arranged and computed so as to reproduce the losses and variations that will be undergone by the programming voltage signal Vpp before it is applied to the memory cells.

FIG. 6 shows a succession of two pulses of the programming voltage signal corresponding to an erase type programming, operation followed by a write type programming operation obtained with a programming device according to the invention. Each pulse typically lasts two milliseconds, the voltage build-up ramp lasting about one millisecond.

If the regulation circuit 30 receives the programming voltage signal Vpp at input and not the high voltage signal V-HI, so long as the maximum voltage level is not reached by the programming voltage signal, namely Vppe for erasure or Vppw for writing, the regulation by the regulation circuit 30 according to the invention does not come into play. In other words, the charge pump continues to work. For this reason, during the period referenced p1 in FIG. 6, which corresponds to the voltage build-up of the signal Vpp, the pump is not regulated. During this period p1, the high voltage signal V-HI can rise to dangerous levels for the circuits that perceive this voltage.

Thus, in one improvement shown in FIG. 5, the programming device according to the invention comprises means to regulate not only the programming signal Vpp with respect to the reference voltages V1 and V2 but also the high voltage signal V-HI with respect to a third reference voltage V3 which is greater than the reference voltages V1 and V2.

Thus, the pump is always regulated, first of all with respect to a reference voltage V3 and then with respect to a reference voltage V1 or V2, below V3. In practice, if $Run_1$ is the reference given to the regulation signal provided by the regulation circuit 30 for the regulation of the high voltage signal V-HI with respect to the reference signal V3 and $Run_2$ is the reference given to the regulation signal provided by the regulation circuit 30 for the regulation of the programming voltage signal Vpp with respect to the reference voltages V1 and V2, then it is enough to combine these two signals $Run_1$ and $Run_2$ to obtain a regulation signal Run enabling a very efficient regulation of the programming voltage, as closely as possible to the memory cells, while at the same time ensuring the operating safety of the charge pump. FIG. 5 gives a schematic view of this combination by a combinational logic gate 32, receiving the two signals $Run_1$ and $Run_2$ as inputs and giving the total regulation signal Run at output.

FIG. 7a shows an exemplary practical embodiment of the regulation circuit 30 according to the invention.

This circuit comprises a set of zener diodes D1, D2 and D3 series-connected and reverse-connected between the input voltage Ve to be regulated and a node A. In the example, this set gives the second reference voltage V2 for the write type programming operation. This voltage V2 is equal to the sum of the zener voltages. In the example, there are three identical zener diodes. These diodes are chosen in a technology providing for high stability of the associated zener voltage to obtain efficient regulation. They are obtained for example by means of the technological method described in the Italian patent IT 2 222 8 A/89, which provides a very stable zener voltage of 5 volts. With diodes of this kind, V2=1.5 volts are obtained.

Between the node A and a node B, there is a transistor M1 controlled at its gate by the write/erase control signal, referenced Write. Between the node A and a node B, and in parallel on the transistor M1, there is furthermore a diode-mounted transistor M2 (with the gate and drain connected). This diode-mounted transistor provides voltage at its terminals equal to the threshold voltage, in the range of 1 volt.

When the signal Write is at a logic level corresponding to the erase operation, 0 in the example, the transistor M1 is not conductive. The transistor M2 is then diode-mounted, forward-connected and series-connected with the zener diodes between the input E of the regulation circuit and the node B. This assembly formed by zener diodes and the transistor M2 gives the first reference voltage V1. In the example, V1 is equal to 16 volts.

The comparison circuit is an inverter circuit controlled by the voltage level at the internal node B. It is formed more specifically by a first N type native MOS transistor M3 connected between the node B and the ground, and two MOS transistors M4 and M5 series-connected between the logic supply voltage Vcc and the ground. The transistor M4 is a P type MOS transistor connected between the logic supply voltage Vcc and an output node N. The transistor M5 is a native N type MOS transistor connected between the node N and the ground. It has its gate connected to the node B.

Two series-connected invertors I1 and I2 are furthermore designed to provide the regulation signal Run on the basis of the signal obtained at the node N.

The transistors M3 and M4 are biased at their gates respectively by a bias voltage $V_{m1}$ and $V_{m2}$, so as to let through substantially a same current in the range of about 1 micro-ampere.

The working of the regulation circuit is as follows. Starting with the case of an erase operation, the transistor M1 is not on. A reference voltage is dictated by the zener diodes and the transistor M2, equal to the first reference voltage V1 which, in the example, is equal to 16 volts. If the input voltage F is smaller than V1, no current flows through this arm. The node B is pulled to zero by the transistor M3. The transistor M5 which has its gate at zero volts is not on. The voltage at the node N is dictated by the transistor M4 which substantially brings the logic supply voltage Vcc to this node. At output, there is a regulation signal Run at 1. This regulation signal 1 activates the charge pump or keeps it active.

If the input voltage E becomes greater than the voltage V1, the voltage of the node B rises, thus turning the transistor M5 on as soon as there are at least 0.5 volts at the node B (500 millivolts, typical threshold of a native transistor for a given technology). The node N is drawn to zero by the transistor M5. The signal Run at output goes to zero, controlling the stoppage of the charge pump.

In practice, to the input E of the regulation circuit 30, there is applied either the high voltage signal V-HI or preferably the programming voltage signal Vpp, with simulation or non-simulation of losses and variations in voltage due to the cell selection circuitry.

FIG. 7b shows the case where the regulation circuit according to the invention provides for the regulation of the programming voltage signal Vpp (or $Vpp_s$) and that of the high voltage signal V-HI. In this case, to the input E of the regulation circuit 30, there is applied the programming voltage signal Vpp (or $Vpp_s$) and at the input E', there is applied the high voltage signal V-HI.

It is indeed possible, advantageously, to carry out the comparison and therefore the regulation, with the same circuit. The regulation of the high voltage signal with respect to V3 then takes place before the regulation with respect to V1 or V2, the programming voltage signal Vpp being produced from the high voltage signal V-HI.

As compared with the regulation circuit shown in FIG. 7a, it is enough to add a second input E' receiving the high voltage signal V-HI and a reference arm between the second input E' and the internal node B, this arm comprising a series of diodes, series-connected in reverse so as to obtain the desired reference voltage V3. In the example, there are thus three zener diodes D5, D6, D7 with a zener voltage of 5 volts and two diode-mounted transistors, M6 and M8, with a threshold voltage of 1 volt each. This set of diodes can be connected between the input E' and the internal node B as shown in the figure. The third reference voltage V" is then equal to 3×5+2×1=17 volts.

This set of diodes can also be connected between the input E' and the internal node A. In this case, the third voltage reference takes a different value, depending on the level of the write/erase signal Write: in erasure, V3=19 volts and in writing V3=18 volts.

Furthermore, should the signals Vpp and V-HI be both regulated together, it is necessary to prevent the current from flowing from the arm associated with the input E into the arm associated with the input E' and vice versa. It can therefore be planned to have, in each arm, an additional diode that will not let through current except in the desired direction.

In the example, these diodes are formed by N type MOS transistors, each having its gate connected to its drain. In the example, these transistors are native transistors to have the lowest possible threshold, in the range of 0.5 volts.

Thus, between the diode D3 and the node A there is a protection transistor M8. Similarly, between the transistor M7 and the node B (or else the transistor M7 and the node A) there is a protection transistor M9.

Chronologically, the level of the high voltage signal V-HI rises before the level of the programming voltage signal Vpp. If this level of the high voltage signal goes beyond the reference voltage V3, the regulation works and the signal Run goes to 0 according to the principle explained here above and stops the pump until the level of the high voltage signal returns to a level below this reference voltage V3. When the level of the programming voltage signal Vpp rises and goes beyond the current reference voltage V1 or V2, depending on the programming operation to be performed, the regulation here too works so as to control the pump.

The invention that has just been described and whose exemplary embodiments have been explained can be applied to any integrated circuit comprising an electrically programmable non-volatile memory. It uses circuits well known to those skilled in the art, namely a charge pump, a voltage ramp generator and a circuitry for the selection of memory cells.

Although a specific embodiment of the invention has been disclosed, it will be understood by those having skill in the art that changes can be made to this specific embodiment without departing from the spirit and scope of the invention. The scope of the invention is not to be restricted, therefore, to the specific embodiment, and it is intended that the appended claims cover any and all such applications, modifications, and embodiments within the scope of the present invention.

What is claimed is:

1. A regulation circuit for regulating the generation of a signal to perform a programming operation, including an erase type operation and a write type operation, for an electrically programmable non-volatile memory having a plurality of memory cells wherein at least one memory cell has at least one transistor with a floating gate attached thereto, the regulation circuit comprising:

a reference input for receiving an input reference signal;

a first reference signal for an erase type operation;

a second reference signal for a write type operation; and a control input to receive a control signal, for selecting a reference signal among the first and the second reference signal to be applied to the reference input according to the programming operation to be performed;

wherein a magnitude of the first reference signal and a magnitude of second reference signal are set so that an electric field of approximate equal absolute magnitude is created on a floating gate of a transistor attached to the at least one memory cell during the erase type operation and the writing type operation.

2. The regulation circuit according to claim 1, further comprising:

a first circuit for providing an electric field to induce a quantity of charges on the floating gate during the erase type operation;

a second circuit for providing an electric field to induces a quantity of charges on the floating gate during the writing type operation.

3. The regulation circuit according to claim 1, further comprising:

a ramp generator with an input and an output, the output for providing a programming signal in the form of a pulse; and a charge pump circuit connected to the input of the ramp generator for providing a high voltage signal, wherein the programming signal from the output of the generator is transmitted to the at least one memory cell for the application thereto of a control voltage corresponding to the programming operation to be performed, wherein the input reference signal is compared with the programming signal.

4. The regulation circuit according to claim 2, further comprising:
   a ramp generator with an input and an output, the output for providing a programming signal in the form of a pulse; and
   a charge pump circuit connected to the input of the ramp generator for providing a high voltage signal, wherein the programming signal from the output of the generator is transmitted to the at least one memory cell for the application thereto of a control voltage corresponding to the programming operation to be performed, wherein the input reference signal is compared with the programming signal.

5. The regulation circuit according to claim 3, wherein the programming signal compared with the first reference signal is a high voltage signal.

6. The regulation circuit according to claim 3, wherein the regulation circuit comprises:
   a circuit for the simulation of a circuitry for the selection of the at least one memory cell through which the programming voltage signal is applied thereto.

7. The regulation circuit according to claim 4, wherein the regulation circuit comprises:
   a circuit for the simulation of a circuitry for the selection of the at least one memory cell through which the programming voltage signal is applied thereto.

8. The regulator circuit according to claim 3, wherein the signal applied to the reference input is the programming voltage signal and wherein the regulator circuit further comprises:
   means to regulate the high voltage signal produced by the charge pump circuit, with respect to a third reference signal having a value greater than the first reference signal and second reference signal.

9. The regulator circuit according to claim 4, wherein the signal applied to the reference input is the programming voltage signal and wherein the regulator circuit further comprises:
   means to regulate the high voltage signal produced by the charge pump circuit, with respect to a third reference signal having a value greater than the first reference signal and second reference signal.

10. The regulator circuit according to claim 3, further comprising:
    an internal node;
    a first set of reverse series-connected diodes between the first reference output of the regulation circuit and the internal node;
    a selection switch circuit enabling the selection of all or part of the diodes of the first set of diodes as a function of the programming operation to be performed, so as to produce the first reference and the second reference signal corresponding to the programming operation being performed; and
    a comparator with an output for providing a regulation signal applied to the charge pump circuit, the switching of which is controlled by the voltage at the internal node.

11. The regulator circuit according to claim 4, further comprising:
    an internal node;
    a first set of reverse series-connected diodes between the first reference output of the regulation circuit and the internal node;
    a selection switch circuit enabling the selection of all or part of the diodes of the first set of diodes as a function of the programming operation to be performed, so as to produce the first reference and the second reference signal corresponding to the programming operation being performed; and
    a comparator with an output for providing a regulation signal applied to the charge pump circuit, the switching of which is controlled by the voltage at the internal node.

12. The regulator circuit according to claim 10, wherein the regulation circuit comprises:
    a second input to receive the high voltage signal; and
    a second set of reverse series-connected diodes between this second input and the internal node defining the third reference signal.

13. The regulator circuit according to claim 2, wherein the electric field during the erase operation is induced by a voltage Vppe and the electric field during the erase is induced by Vppw and wherein Vppe*Ag=Vppw(1−Ad) and Ag is set to be approximately equal to (1−Ad) and the value of Ag is set depending on the type of memory cell technology.

14. The regulator circuit according to claim 13 wherein the memory cell technology is EEPROM technology and the value of Ag is approximately 0.7 and the value of Ad approximately 0.25.

15. A method for regulating the generation of a signal to perform a programming operation, including an erase type operation and a write type operation, for an electrically programmable non-volatile memory having a plurality of memory cells wherein at least one memory cell has at least one transistor with a floating gate attached thereto, the regulation method comprising the steps of:
    receiving a reference input for receiving an input reference signal;
    receiving a first reference signal for an erase type operation;
    receiving a second reference signal for a write type operation;
    receiving a control signal;
    selecting a reference signal among the first and the second reference signal to be applied to the reference input according to the programming operation to be performed of an writing type operation or a reading type operation; and
    setting a magnitude of the first reference signal and a magnitude of the second reference signal so that an electric field of approximate equal absolute magnitude is created on a floating gate of a transistor attached to the at least one memory cell during the erase type operation and the writing type operation.

16. She method according to claim 15, wherein the step of setting a magnitude of the first reference signal and a magnitude of the second reference signal further includes the sub-steps of:
    setting a magnitude of the first reference signal during the erase operation to induced a voltage Vppe;
    setting a magnitude of the second reference signal during the writing operation to induced a voltage Vppw so that Vppe*Ag=Vppw (1−Ad);
    making Ag to be approximately equal to (1−Ad); and
    selecting the value of Ag depending on the type of memory cell technology.

17. The method according to claim 16, wherein the step of selecting the value of Ag includes selecting a value of Ag to approximately 0.7 for EPROM memory cell technology.

18. A semiconductor device comprising:
- a non-volatile memory array having a plurality of memory cells wherein each memory cell has at least one transistor with a floating gate attached thereto and each memory cell is capable of erasure and programming;
- a first reference input for receiving an erase signal for erasing one or more memory cells in the non-volatile memory;
- a second reference input for receiving a write signal for writing one or more memory cells in the non-volatile memory,
- a regulation circuit coupled to the first reference input and coupled to the second reference input for regulating the magnitude of an erasure signal and for regulating the magnitude of the write signal so that an electric field of approximate equal absolute magnitude is created on the floating gate of one or more memory cells during an erase type operation and a write type operation.

19. The semiconductor device according to claim 18, wherein the electric field during the erase operation is induced by a voltage Vppe and the electric field during the write operation is induced by Vppw and wherein Vppe*Ag= Vppw(1−Ad) and Ag is set to be approximately equal to (1−Ad) and the value of Ag is set depending on the type of memory cell technology.

20. The semiconductor device according to claim 19, wherein the memory cell technology is EEPROM technology and the value of Ag is approximately 0.7 and the value of Ad approximately 0.25.

21. A device for the programming of cells of an electrically programmable non-volatile memory, comprising:
- a charge pump voltage generation circuit comprising:
  - a charge pump circuit; and
  - a ramp generator with an input coupled to the charge pump circuit, wherein the ramp generator gives a programming voltage signal to a memory cell selection circuit to erase or write at least one memory cell;
- a regulation circuit comprising:
  - first means to regulate the programming voltage signal generated by the charge pump with respect to at least a first reference voltage; and
  - a circuit for the simulation of the cell selection circuit, the simulation circuit receiving the programming voltage signal at an input and giving, at an output, a signal to be regulated applied to the first means.

22. A programming device according to claim 21, wherein the regulation circuit comprises:
- second means of regulation with respect to a second reference voltage, the second voltage having a voltage level higher than the first reference voltage, to regulate the programming voltage signal generated by the ramp generator.

23. A programming device according to claim 21, wherein the regulation circuit comprises:

- means for selecting the first reference voltage or a second reference voltage for applying to the first means, so that selecting is a function of whether an erasure operation or a write operation is to be performed.

24. A programming device according to claim 22, wherein the voltage regulation circuit comprises:
- means for selecting the first reference voltage or a second reference voltage for applying to the first means, so that selecting is a function of the whether an erasure operation or a write operation is to be performed.

25. A programming device according to claim 24, wherein the levels of the first and the second reference voltages are such that the electrical fields applied to a floating gate transistors of the memory cell is identical in absolute value for the erasure operation and the write operation.

26. A programming device according to claim 24, wherein the regulation circuit comprises:
- a first set of reverse-connected and series-connected diodes between a first input of the regulation circuit and an internal node;
- a selection switch circuit enabling the selection of at least one diode of the first set as a function of the whether an erasure operation or a write operation is to be performed, so as to give the first or the second reference voltage; and
- a comparison device giving at an output, a regulation signal applied to the charge pump circuit, the switching of which is controlled by the voltage at the internal node.

27. A programming device according to claim 25, wherein the regulation circuit comprises:
- a first set of reverse-connected and series-connected diodes between a first input of the regulation circuit and an internal node;
- a selection switch circuit enabling the selection of at least one diode of the first set as a function of the whether an erasure operation or a write operation is to be performed, so as to give the first or the second reference voltage; and
- a comparison device giving at an output, a regulation signal applied to the charge pump circuit, the switching of which is controlled by the voltage at the internal node.

28. A programming device according to claim 27 wherein the regulation circuit comprises a second set of series-connected and reverse-connected diodes, connected between the input of ramp generator and the internal node.

29. A programming device according to claim 21, where the programming device is coupled to an integrated circuit with electrically programmable, non-volatile memory.

* * * * *